(12) United States Patent
Kim et al.

(10) Patent No.: US 9,426,895 B2
(45) Date of Patent: Aug. 23, 2016

(54) METHOD OF FABRICATING TOUCH SCREEN PANEL

(71) Applicant: SAMSUNG DISPLAY CO., LTD., Yongin-si, Gyeonggi-Do (KR)

(72) Inventors: Ji-Hyun Kim, Yongin-si (KR); Sung-Kyun Park, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/836,989

(22) Filed: Aug. 27, 2015

(65) Prior Publication Data

US 2016/0198575 A1    Jul. 7, 2016

(30) Foreign Application Priority Data

Jan. 5, 2015  (KR) ......................... 10-2015-0000848

(51) Int. Cl.
*H05K 3/06* (2006.01)
*H05K 3/00* (2006.01)
*G06F 3/041* (2006.01)

(52) U.S. Cl.
CPC ............. *H05K 3/061* (2013.01); *G06F 3/0412* (2013.01); *H05K 3/0055* (2013.01); *G06F 2203/04103* (2013.01)

(58) Field of Classification Search
None
See application file for complete search history.

(56) References Cited

U.S. PATENT DOCUMENTS

| | | | | |
|---|---|---|---|---|
| 5,888,859 A | * | 3/1999 | Oku ................... | H01L 21/28587 257/E21.314 |
| 2007/0082432 A1 | * | 4/2007 | Lee .................... | H01L 27/1214 438/149 |
| 2010/0012937 A1 | * | 1/2010 | Lee ........................ | G06F 3/0412 257/59 |
| 2011/0227839 A1 | * | 9/2011 | Rho ........................ | G06F 3/044 345/173 |
| 2012/0018200 A1 | | 1/2012 | Kim et al. | |
| 2013/0279063 A1 | * | 10/2013 | Yoo ........................... | H05F 3/00 361/220 |
| 2014/0145158 A1 | * | 5/2014 | Choi ................... | H01L 27/3246 257/40 |
| 2014/0151325 A1 | | 6/2014 | Baek | |
| 2015/0294859 A1 | * | 10/2015 | Sera ......................... | G03F 7/40 438/527 |

FOREIGN PATENT DOCUMENTS

| | | |
|---|---|---|
| KR | 10-0488939 B1 | 5/2005 |
| KR | 10-1118727 B1 | 3/2012 |
| KR | 10-2014-0016626 A | 2/2014 |
| KR | 10-2014-0070104 A | 6/2014 |

* cited by examiner

Primary Examiner — Allan Olsen
(74) Attorney, Agent, or Firm — Lee & Morse, P.C.

(57) ABSTRACT

A method of manufacturing a touch screen panel, including forming first and second conductive layers and an organic insulating layer on a substrate; forming a first organic insulating pattern having a first thickness and a second organic insulating pattern having a second thickness, the second thickness being larger than the first thickness; forming first and second conductive patterns; exposing a part of the second conductive pattern to form a third organic insulating pattern having a thickness smaller than the second thickness; removing the exposed second conductive pattern; forming an organic insulating capping layer surrounding the first and second conductive patterns positioned under the third organic insulating pattern; and forming a third conductive layer on the first conductive pattern and the organic insulating capping layer, the first conductive pattern being exposed, and then forming a connection pattern electrically connected with the exposed first conductive pattern using a second mask.

13 Claims, 5 Drawing Sheets

METHOD OF FABRICATING TOUCH SCREEN PANEL

CROSS-REFERENCE TO RELATED APPLICATION

Korean Patent Application No. 10-2015-0000848, filed on Jan. 5, 2015, in the Korean Intellectual Property Office, and entitled: "Method Of Fabricating Touch Screen Panel," is incorporated by reference herein in its entirety.

BACKGROUND

1. Field

Embodiments relate to a method of fabricating a touch screen panel.

2. Description of the Related Art

A touch screen panel is an input device that may allow a user to input a command by selecting indicated contents shown on a screen of, for example, an image display device, by using a hand of a person or an object.

A touch screen panel may be provided on a front surface of the image display device and may convert a contact position, with which the hand of the person or the object may be in direct contact, into an electrical signal, and indicated contents selected at the contact position may be received as an input signal.

SUMMARY

Embodiments may be realized by providing a method of manufacturing a touch screen panel, including forming a first conductive layer, a second conductive layer, and an organic insulating layer on a substrate; forming a first organic insulating pattern having a first thickness and a second organic insulating pattern having a second thickness by disposing a first mask on the organic insulating layer, the second thickness being larger than the first thickness; forming first and second conductive patterns by etching the first and second conductive layers at exposed portions using the first and second organic insulating patterns as masks; exposing a part of the second conductive pattern by ashing the first organic insulating pattern and ashing the second organic insulating pattern to form a third organic insulating pattern having a thickness smaller than the second thickness; removing the exposed part of the second conductive pattern by etching and exposing the first conductive pattern positioned under the second conductive pattern; forming an organic insulating capping layer surrounding the first and second conductive patterns positioned under the third organic insulating pattern by thermally curing the third organic insulating pattern; and forming a third conductive layer on the first conductive pattern and the organic insulating capping layer, the first conductive pattern being exposed, and then forming a connection pattern electrically connected with the exposed first conductive pattern using a second mask.

The first conductive layer may include a transparent material.

The transparent material may include one or more of an indium tin oxide (ITO), a silver nano wire (AgNW), or a conductive polymer.

The second conductive layer may include a material having a lower resistance value than that of the first conductive layer.

The material having the lower resistance value may include one or more of molybdenum (Mo), silver (Ag), titanium (Ti), aluminum (Al), or copper (Cu).

The organic insulating layer may include a material having thermal flow.

The first mask may include a half-tone mask.

The etching may include wet etching.

Removing the exposed part of the second conductive pattern by etching and exposing the first conductive pattern positioned under the second conductive pattern may include over-etching a lateral surface of the second conductive pattern positioned under the third organic insulating pattern.

A width of the second conductive pattern may be smaller than a width of the third organic insulating pattern.

The connection pattern may be on the organic insulating capping layer.

The connection pattern may include a transparent conductive material.

Forming the first and second conductive patterns by etching the first and second conductive layers at the exposed portions using the first and second organic insulating patterns as masks may include forming a connection part crossing the connection pattern and integrally formed with the second conductive pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
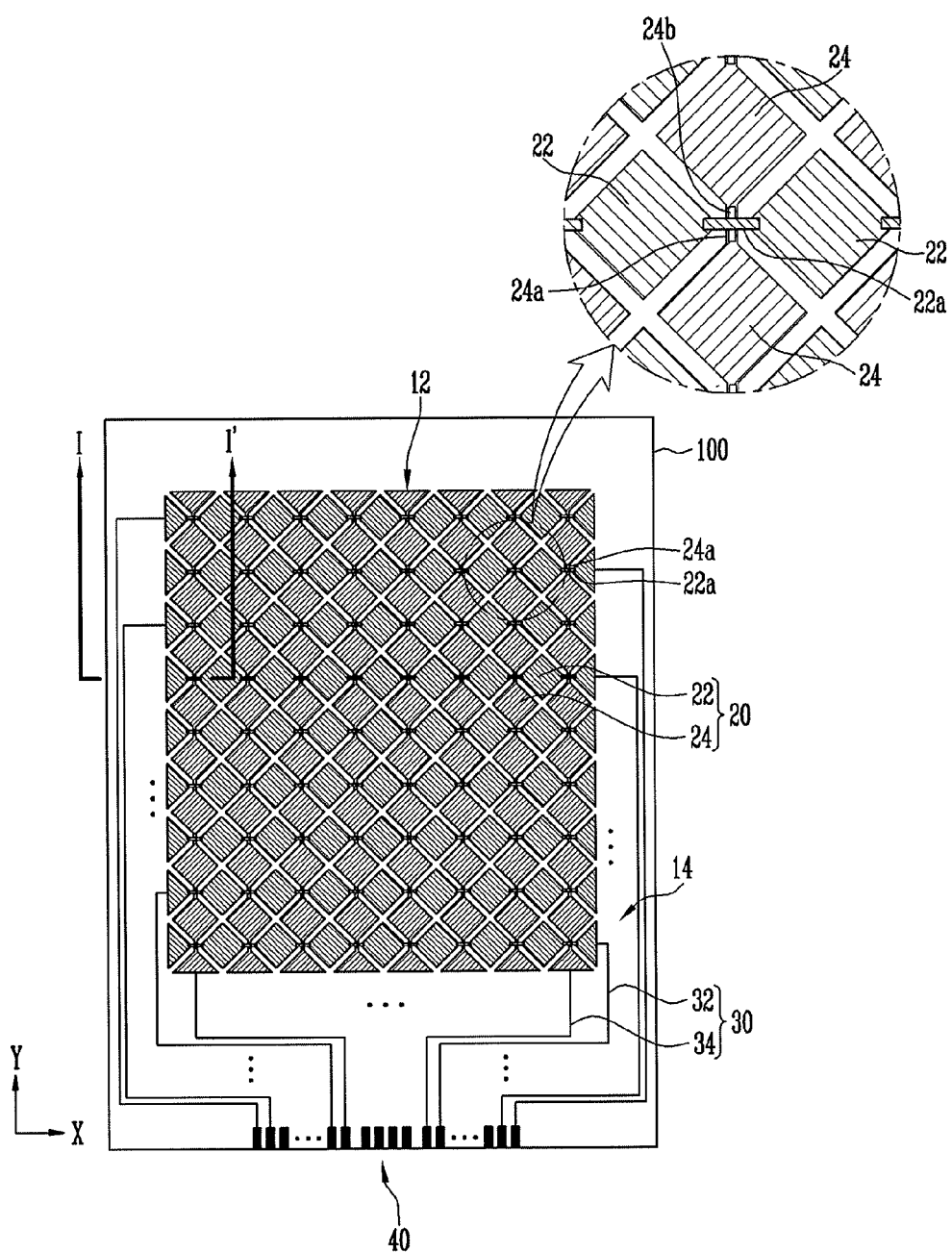
FIG. 1 illustrates a schematic top plan view for describing a touch screen panel according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
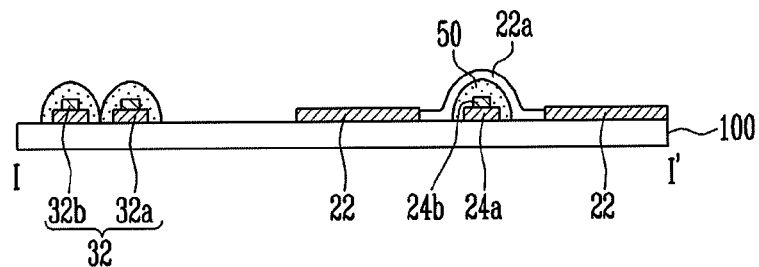
FIG. 2 illustrates a cross-sectional view taken along line I-I' of FIG. 1.

FIG. 1 illustrates a schematic top plan view for describing a touch screen panel according to an exemplary embodiment, and FIG. 2 illustrates a cross-sectional view taken along line I-I' of FIG. 1.

Referring to FIGS. 1 and 2, a touch screen panel according to an exemplary embodiment may include a substrate 100 including a detection area 12 and a peripheral area 14. As the substrate 100, a substrate formed of a transparent insulating material, such as glass or plastic, or a flexible substrate may be used.

The detection area 12 is an area that may be used for detecting a position of a contact of a hand or an object, and for example, the detection area 12 may be disposed at a center of the substrate 100, and a plurality of detection electrodes 20 may be formed on the substrate 100 of the detection area 12. The plurality of detection electrodes 20 may include a plurality of first detection patterns 22 arranged to be connected with each other in one direction (for example, an X-axis direction), and a plurality of second detection patterns 24 arranged to be connected with each other in a direction (for example, a Y-axis direction) crossing the first detection patterns 22.

The first detection pattern 22 and the second detection pattern 24 may be formed of, e.g., include, a transparent conductive material. For example, the transparent conductive material may include one or more of an indium tin oxide (ITO), a silver nano wire (AgNW), graphene, or conductive polymers.

The first detection patterns 22 or the second detection patterns 24 may be formed to be separated in a disconnected and independent pattern and may be connected to each other through a bridge. For example, the second detection patterns 24 may be formed in a connected state by connection parts 24a, and the first detection patterns 22 may be formed to be separated from each other and connected with each other by connection patterns 22a serving as bridges.

The connection pattern 22a may be disposed to cross the connection part 24a of the second detection pattern 24, and may be electrically coupled with the connection part 24a of the second detection pattern 24 by an organic insulating capping layer 50 which is to be described below.

The connection part 24a may be formed of, e.g., include, the same material as that of the first detection pattern 22 and the second detection pattern 24. An auxiliary pattern 24b patterned to be further recessed inwardly from both lateral surfaces of the connection part 24a may be formed on the connection part 24a. For example, a width of the auxiliary pattern 24b may be smaller than that of the connection part 24a.

The organic insulating capping layer 50 may be patterned to be formed only on the auxiliary pattern 24b in the detection area 12. The connection pattern 22a may be disposed to cross the connection part 24a positioned under the organic insulating capping layer 50 on the organic insulating capping layer 50, and may be connected with the first detection patterns 22, which are adjacent to each other, with the connection part 24a interposed therebetween.

The peripheral area 14 may be a peripheral portion of the detection area 12, and a plurality of wires 30 coupled with the plurality of detection electrodes 20 and a pad part 40 coupled with the plurality of wires 30 may be formed on the substrate 100.

The pad part 40 may be electrically coupled with a driving circuit board for driving the touch screen panel.

The plurality of wires 30 may include first position detection wires 32 coupled with the plurality of first detection patterns 22 and second position detection wires 34 coupled with the plurality of second detection patterns 24. The wires 30 including the first position detection wire 32 and the second position detection wire 34 may be formed of, e.g., include, a transparent conductive material or a metal having a low resistance value, or in a stacked structure of a transparent conductive material and a metal.

The first position detection wire 32 may include a first of first position detection pattern 32a and a second of first position detection pattern 32b sequentially stacked on the substrate 100.

The first of first position detection pattern 32a may be formed of, e.g., include, the same transparent conductive material as that of the first detection pattern 22, and the second of first position detection pattern 32b may be formed of, e.g., include, a metal material having lower resistance than that of the first of first position detection pattern 32a. The second of first position detection pattern 32b may be patterned to be recessed inwardly than, e.g., inwardly of, both lateral surface of the first of first position detection pattern 32a, and a width of the second of first position detection pattern 32b may be smaller than a width of the first of first position detection pattern 32a.

The second position detection wire 34 may include a first of second position detection pattern and a second of second position detection pattern sequentially stacked on the substrate 100 similar to the first position detection wire 32.

Hereinafter, a method of fabricating a touch screen panel according to the exemplary embodiment including the aforementioned structure will be described.

FIGS. 3A to 3I illustrate cross-sectional sequential views a method of fabricating the touch screen panel illustrated in FIG. 2, and FIGS. 4A to 4D illustrate top-plan views for describing the method of fabricating the touch screen panel illustrated in FIG. 2.

Figure 3A:
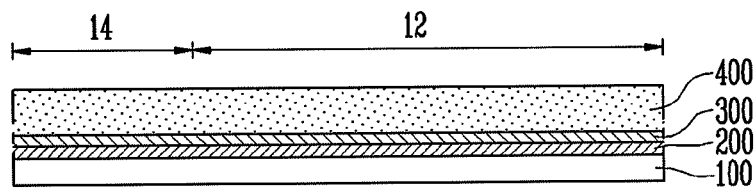
FIGS. 3A to 3I illustrate cross-sectional sequential views of a method of fabricating the touch screen panel illustrated in FIG. 2.

Referring to FIG. 3A, a first conductive layer 200, a second conductive layer 300, and an organic insulating layer 400 may be sequentially formed on one surface of the substrate 100 including the detection area 12 and the peripheral area 14.

As the substrate 100, a synthetic resin, such as a polyethylene terephthalate (PET) film, a polyethylene naphthalate (PEN) film, polycarbonate (PC), and poly methyl methacrylate (PMMA), and various glass, such as glass or tempered glass, may be used.

The first conductive layer 200 may be formed of a transparent conductive material. For example, the transparent conductive material may include one or more of an ITO, a silver nano wire (AgNW), graphene, or conductive polymers.

The second conductive layer 300 may be formed of a material having a lower resistance value than that of the first conductive layer 200, and may include one of molybdenum (Mo), silver (Ag), titanium (Ti), aluminum (Al), and copper (Cu).

The organic insulating layer 400 may be formed of one of commercial polymer (PMMA and PS), a polymer derivate having a phenol group, an acrylic-based polymer, an imide-based polymer, an aryl ether-based polymer, an amide-based polymer, a fluorine-based polymer, and a vinyl alcohol-based polymer. In an embodiment, the organic insulating layer 400 may be formed of a material having a flowing property (thermal flow) during heat curing.

Figure 3B:
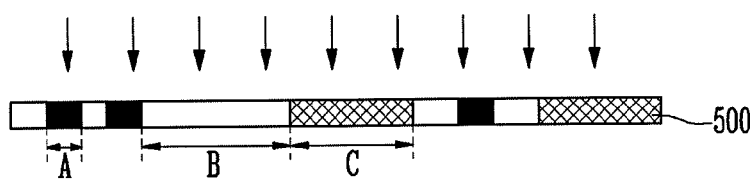
Figure 3B:
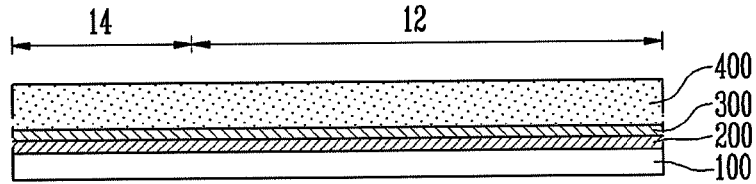
Figure 3C:
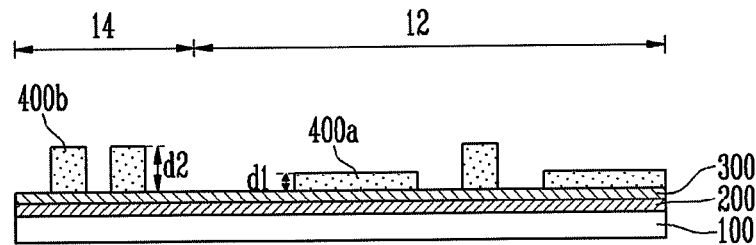
Figure 4A:
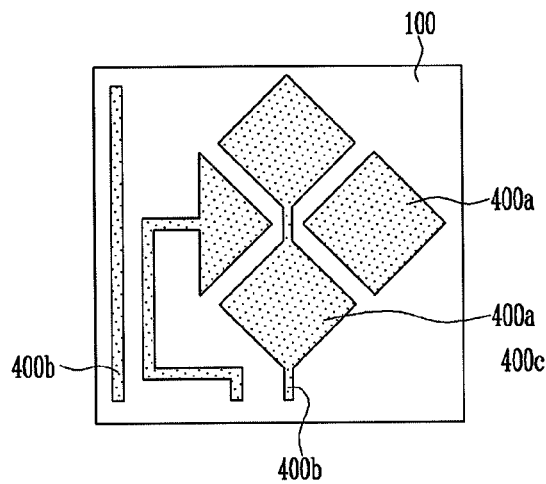
FIGS. 4A to 4D illustrate top-plan views for describing the method of fabricating the touch screen panel illustrated in FIG. 2.

Next, referring to FIG. 3B, a first mask 500 including a blocking portion A, a transmitting portion B, and a semi-transmitting portion C may be disposed on the organic insulating layer 400, and then first and second organic insulating patterns 400a and 400b having different thicknesses may be formed as illustrated in FIGS. 3C and 4A by performing a first mask process including a series of unit processes, such as exposure. A half-tone mask may be used as the first mask 500.

The first organic insulating pattern 400a may be formed to correspond to the semi-transmitting portion C of the first mask 500, and may have a first thickness d1. The second organic insulating pattern 400b may be formed to correspond to the blocking portion A of the first mask 500, and may have a second thickness d2 larger than the first thickness d1.

The organic insulating layer 400 (see FIG. 3B) corresponding to the transmitting portion B of the first mask 500 may be removed from the substrate 100, and the second conductive layer 300 positioned under the organic insulating layer 400 may be exposed, e.g., to the outside.

Figure 3D:
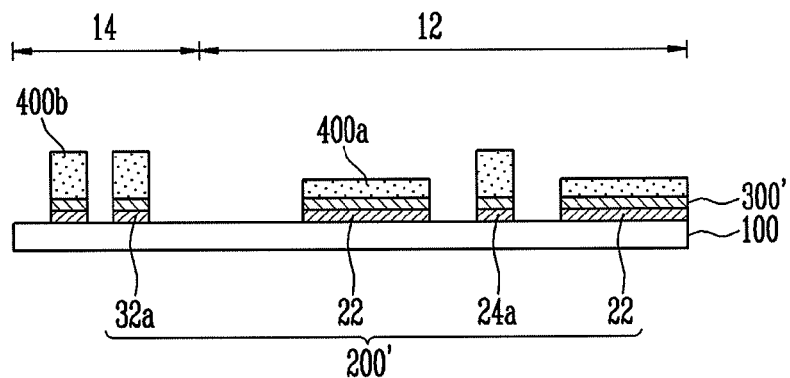

Referring to FIG. 3D, an etching process may be performed on the first and second conductive layers 200 and 300 formed on the substrate 100 by using the first and second organic insulating patterns 400a and 400b as an etching mask. The first and second conductive layers 200 and 300 may be batch etched to be first and second conductive patterns 200' and 300'.

The first conductive pattern 200' may include the first of first position detection pattern 32a formed in the peripheral area 14, the first detection pattern 22 formed in the detection area 12, and the connection part 24a.

Figure 3E:
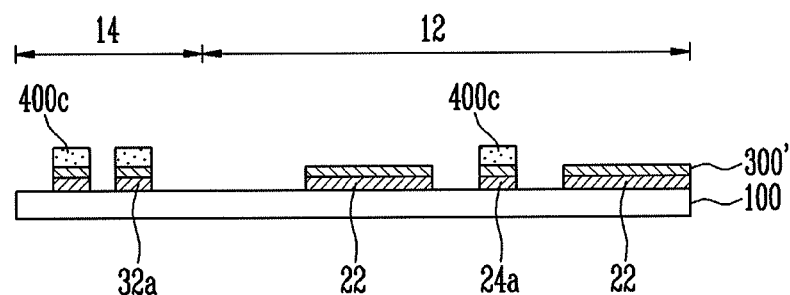
Figure 4B:
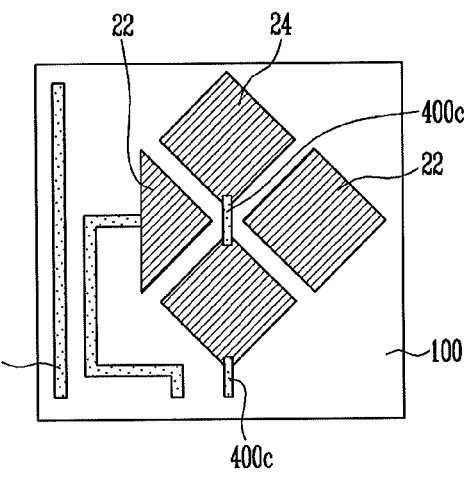

Referring to FIGS. 3E and 4B, the first organic insulating pattern 400a may be removed by performing an ashing process using, for example, oxygen plasma, to expose the second conductive pattern 300' formed on the first detection pattern 22 to the outside.

Simultaneously, a third organic insulating pattern 400c having a smaller thickness than the thickness d2 of the second organic insulating pattern 400b may be formed. The third organic insulating pattern 400c may be disposed at positions at which the plurality of wires 30 (see FIG. 1) and the auxiliary pattern 24b (see FIG. 2) are to be formed.

Figure 3F:
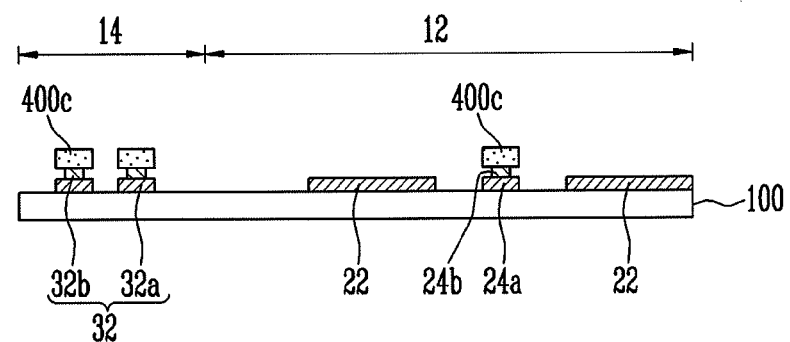

Referring to FIG. 3F, the second conductive pattern 300', which may be exposed to the outside, may be removed by performing a wet etching process by using the third organic insulating pattern 300c as an etching mask to expose the first detection pattern 22 to the outside.

When an etching time is increased or an etchant having a larger etch rate to the second conductive pattern 300' is used during the wet etching process, the second conductive pattern 300' positioned under the third organic insulating pattern 400c may be over-etched, and the second conductive pattern 300' may be positioned at an inner side of the third organic insulating pattern 400c. A width of the second conductive pattern 300' may be smaller than a width of the third organic insulating pattern 400c.

By the wet etching process, the second of first position detection pattern 32b may be formed in the peripheral area 14 of the substrate 100, and the auxiliary pattern 24b may be formed in the detection area 12 of the substrate 100.

The first of first position detection pattern 32a and the second of first position detection pattern 32b, which may be sequentially stacked on the substrate 100 in the peripheral area 14 of the substrate 100, may configure the first position detection wire 32 (see FIG. 1).

Figure 3G:
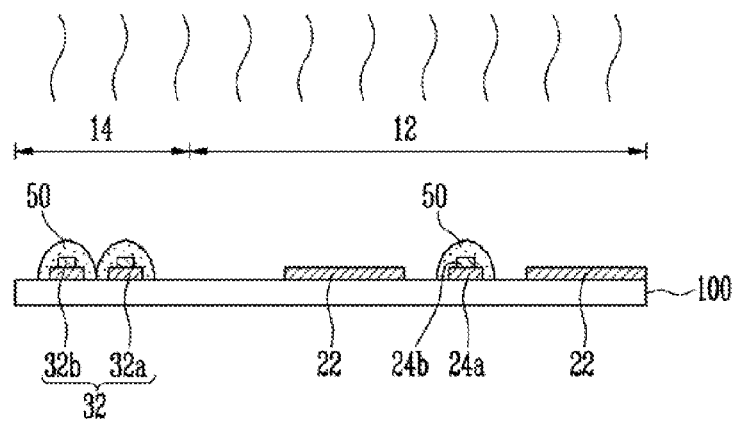
Figure 4C:
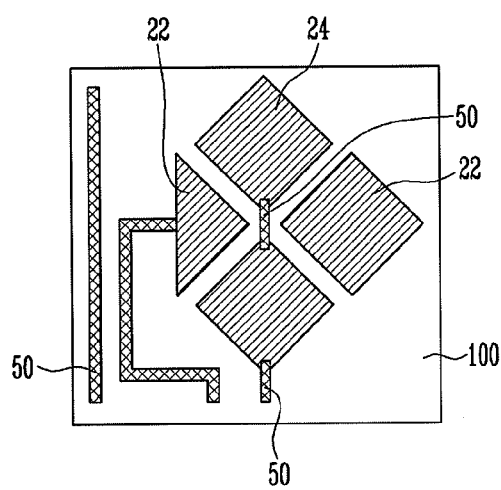

Referring to FIGS. 3G and 4C, the organic insulating capping layer 50 formed on the first position detection wire 32 in the peripheral area 14 of the substrate 100 and the organic insulating capping layer 50 formed on the auxiliary pattern 24b and the connection part 24a in the detection area 12 of the substrate 100 may be formed.

Since the organic insulating capping layer 50 is formed of a material having a flowing property (thermal flow) when thermal curing is generated, the organic insulating capping layer 50 may serve as a passivation layer surrounding the first position detection wire 32 in the peripheral area 14 of the substrate 100 and surrounding the auxiliary pattern 24b and the connection part 24a in the detection area 12 of the substrate 100.

Figure 3H:
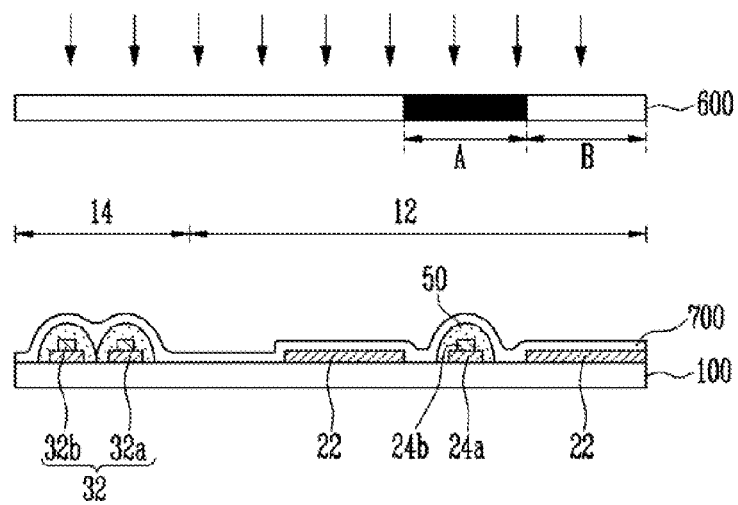
Figure 3I:
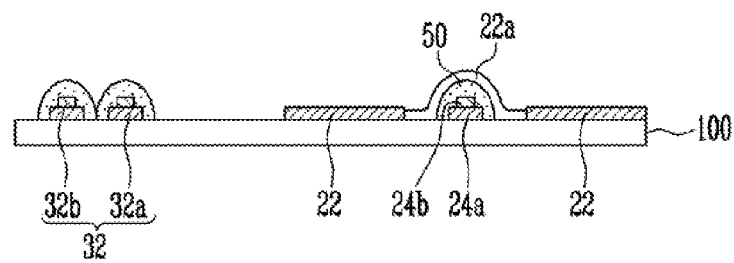
Figure 4D:
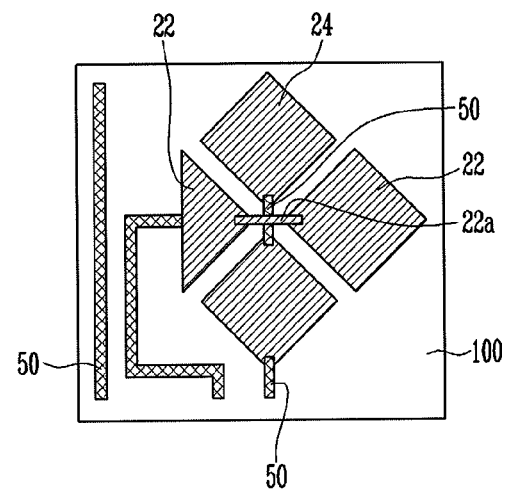

Referring to FIG. 3H, a third conductive layer 700 may be formed on an entire surface of the substrate 100 on which the organic insulating capping layer 50 is formed. Next, a second mask 600 including the blocking portion A and the transmitting portion B may be disposed on the third conductive layer 700, and then the connection pattern 22a for connecting the adjacent first detection patterns 22 may be formed as illustrated in FIGS. 3I and 4D by performing a second mask process including a series of unit processes, such as exposure.

The connection pattern 22a may be formed on the organic insulating capping layer 50, and may include a transparent conductive material, such as an indium tin oxide (ITO) or an indium zinc oxide (IZO). The ITO may have very high hardness, and it may be possible to minimize generation of a scratch in a subsequent process for forming a display device in the touch screen panel. Accordingly, a high quality touch screen panel may be formed.

Forming the connection pattern 22a may include forming a photosensitive layer on the entire surface of the substrate 100 on which the third conductive layer 700 is formed, exposing a part of the third conductive layer 700 forming a photosensitive layer pattern corresponding to the blocking portion A to the outside by using the second mask 600, patterning the third conductive layer 700 exposed to the outside by using the photosensitive layer pattern as a mask, and forming the connection pattern 22a by removing the photosensitive layer pattern.

Since the organic insulating capping layer 50 may be formed only on the auxiliary pattern 24b and the connection part 24a in the detection area 12 of the substrate 100, it may be possible to minimize a length of the connection pattern 22a formed on the connection part 24, and line resistance of the connection pattern 22a may be decreased. It may be possible to decrease a width of the connection pattern 22a similar to the length, and visibility may be improved.

According to the method of manufacturing the touch screen panel according to the exemplary embodiment, the first detection pattern 22 and the second detection pattern 24, the wires 30, and the organic insulating capping layer 50 may be formed by patterning the organic insulating layer 400, which may be positioned at the topmost layer of the substrate 100, as the first organic insulating pattern 400a and the second organic insulating pattern 400b having different thicknesses by using the first mask 500, which may be a half-tone mask.

The mask process may include forming the first detection pattern 22 and the second detection pattern 24, the wires 30, and the organic insulating capping layer 50 by using the first mask 500, and forming the connection pattern 22a for connecting the first detection patterns 22 with each other on the organic insulating capping layer 50 by using the second mask 600, and the number of mask processes may be minimized and the manufacturing process may be simplified.

The length and the width of the connection pattern 22a may be minimized, resistance and visibility may be improved, and an electric characteristic of the touch screen panel may be improved.

By way of summation and review, a scheme of implementing a touch screen panel may include a resistive scheme, a light detection scheme, and a capacitive scheme.

A capacitive touch screen panel may detect a change in capacitance formed between a conductive detection pattern and another surrounding detection pattern or ground electrode when a hand of a person or an object is in contact with the touch screen panel, and may convert a contact position into an electric signal.

A capacitive touch screen panel may include a plurality of first detection patterns formed to be connected in a first direction and a plurality of second detection patterns formed to be connected in a second direction, and coordinates of the contact position may be recognized.

The first detection patterns and the second detection patterns may be formed of the same material on the same layer, and the touch screen panel may have uniform reflectivity.

To prevent first connection patterns for connecting the first detection patterns in the first direction and second connection patterns for connecting the second detection patterns in the second direction from being short-circuited, the first connection patterns and the second connection patterns may be formed on different layers by different processes. An insulating layer for insulating the first connection patterns from the second connection patterns may be formed between the first and second connection patterns.

All of the respective processes for forming the first and second connection patterns and the process for forming the insulating layer may be subject to a patterning process, a mask process may be required in all of the processes, and the processes may become complex and manufacturing efficiency may deteriorate.

In the manufacturing method of the touch screen panel according to the exemplary embodiment, the detection pattern may be formed by using the organic insulating layer and the half-tone mask, and the number of mask processes, e.g., the number of masks, may be decreased and the manufacturing process may be simplified.

In the manufacturing method of the touch screen panel according to the exemplary embodiment, it may be possible to decrease a length and a width of the connection pattern, and line resistance and visibility may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a touch screen panel, comprising:
   forming a first conductive layer, a second conductive layer, and an organic insulating layer on a substrate;
   forming a first organic insulating pattern having a first thickness and a second organic insulating pattern having a second thickness by disposing a first mask on the organic insulating layer, the second thickness being larger than the first thickness;
   forming first and second conductive patterns by etching the first and second conductive layers at exposed portions using the first and second organic insulating patterns as masks;
   exposing a part of the second conductive pattern by ashing the first organic insulating pattern and ashing the second organic insulating pattern to form a third organic insulating pattern having a thickness smaller than the second thickness;
   removing the exposed part of the second conductive pattern by etching and exposing the first conductive pattern positioned under the second conductive pattern;
   forming an organic insulating capping layer surrounding the first and second conductive patterns positioned under the third organic insulating pattern by thermally curing the third organic insulating pattern; and
   forming a third conductive layer on the first conductive pattern and the organic insulating capping layer, the first conductive pattern being exposed, and then forming a connection pattern electrically connected with the exposed first conductive pattern using a second mask.

2. The method as claimed in claim 1, wherein the first conductive layer includes a transparent material.

3. The method as claimed in claim 2, wherein the transparent material includes one or more of an indium tin oxide (ITO), a silver nano wire (AgNW), or a conductive polymer.

4. The method as claimed in claim 1, wherein the second conductive layer includes a material having a lower resistance value than that of the first conductive layer.

5. The method as claimed in claim 4, wherein the material having the lower resistance value includes one or more of molybdenum (Mo), silver (Ag), titanium (Ti), aluminum (Al), or copper (Cu).

6. The method as claimed in claim 1, wherein the organic insulating layer includes a material having thermal flow.

7. The method as claimed in claim 1, wherein the first mask includes a half-tone mask.

8. The method as claimed in claim 1, wherein the etching includes wet etching.

9. The method as claimed in claim 1, wherein removing the exposed part of the second conductive pattern by etching and exposing the first conductive pattern positioned under the second conductive pattern includes over-etching a lateral surface of the second conductive pattern positioned under the third organic insulating pattern.

10. The method as claimed in claim 9, wherein a width of the second conductive pattern is smaller than a width of the third organic insulating pattern.

11. The method as claimed in claim 1, wherein the connection pattern is on the organic insulating capping layer.

12. The method as claimed in claim 11, wherein the connection pattern includes a transparent conductive material.

13. The method as claimed in claim 1, wherein forming the first and second conductive patterns by etching the first and second conductive layers at the exposed portions using the first and second organic insulating patterns as masks includes forming a connection part crossing the connection pattern and integrally formed with the second conductive pattern.

* * * * *